(12) United States Patent
Noh et al.

(10) Patent No.: US 10,756,761 B2
(45) Date of Patent: Aug. 25, 2020

(54) METHOD FOR DIVIDING CARRYING BLOCK OF LDPC CODE AND APPARATUS THEREFOR

(71) Applicant: LG Electronics Inc., Seoul (KR)

(72) Inventors: Kwangseok Noh, Seoul (KR); Bonghoe Kim, Seoul (KR); Jinwoo Kim, Seoul (KR); Ilmu Byun, Seoul (KR); Jongwoong Shin, Seoul (KR); Seunggye Hwang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/344,260

(22) PCT Filed: Jul. 21, 2017

(86) PCT No.: PCT/KR2017/007877
§ 371 (c)(1),
(2) Date: Apr. 23, 2019

(87) PCT Pub. No.: WO2018/079987
PCT Pub. Date: May 3, 2018

(65) Prior Publication Data
US 2020/0186167 A1 Jun. 11, 2020

Related U.S. Application Data

(60) Provisional application No. 62/412,264, filed on Oct. 24, 2016.

(51) Int. Cl.
*H03M 13/11* (2006.01)
*H03M 13/15* (2006.01)
(Continued)

(52) U.S. Cl.
CPC ..... *H03M 13/1102* (2013.01); *H03M 13/155* (2013.01); *H03M 13/251* (2013.01); *H04L 1/0057* (2013.01); *H04L 1/0061* (2013.01)

(58) Field of Classification Search
CPC .......... H03M 13/1102; H03M 13/251; H03M 13/155; H04L 1/0061; H04L 1/0057
See application file for complete search history.

(56) References Cited

U.S. PATENT DOCUMENTS

2006/0206778 A1* 9/2006 Wehn ................. H03M 13/1137
714/758
2006/0206779 A1* 9/2006 Wehn ................. H03M 13/1111
714/758
(Continued)

FOREIGN PATENT DOCUMENTS

| KR | 1020140015602 | 2/2014 |
| KR | 1020160067862 | 6/2016 |
| KR | 101662747 | 10/2016 |

OTHER PUBLICATIONS

M. Jiang, C. Wang, Y. Zhang and C. Zhao, "An improved variable length coding scheme using structured LDPC codes," 2010 International Conference on Wireless Communications & Signal Processing (WCSP), Suzhou, 2010, pp. 1-5. (Year: 2010).*

(Continued)

*Primary Examiner* — Cynthia Britt
(74) *Attorney, Agent, or Firm* — Fish & Richardson P.C.

(57) ABSTRACT

Disclosed are a method for dividing a carrying block of a Low Density Parity Check (LDPC) code and an apparatus therefor. The method for dividing a LDPC code of the present disclosure can obtain a high throughput by using a limited size of shifting network. Moreover, it is possible to prevent degradation in performance due to a minimum size of code block by performing shortening for a large size of code block while minimizing the number of code blocks. Furthermore, in selection of a minimum size of code block, since a minimum size of code block is selected on the basis (Continued)

of shortening for a relatively large size of code block, it is possible to increase the size of the minimum size of code block.

10 Claims, 12 Drawing Sheets

(51) Int. Cl.
*H04L 1/00* (2006.01)
*H03M 13/25* (2006.01)

(56) References Cited

U.S. PATENT DOCUMENTS

| | | | |
|---|---|---|---|
| 2008/0056140 | A1 | 3/2008 | Shida et al. |
| 2009/0183047 | A1 | 7/2009 | Lampe et al. |
| 2013/0156133 | A1* | 6/2013 | Gentile .............. H03M 13/1111 375/340 |
| 2019/0229860 | A1* | 7/2019 | Yoshimura ................ H04L 1/00 |
| 2020/0007161 | A1* | 1/2020 | Dikarev ................ H03M 13/13 |
| 2020/0028523 | A1* | 1/2020 | Li ......................... H04L 1/0003 |
| 2020/0059248 | A1* | 2/2020 | Noh ...................... H03M 13/37 |

OTHER PUBLICATIONS

Seho Myung and Kyeongcheol Yang, "Extension of quasi-cyclic LDPC codes by lifting," Proceedings. International Symposium on Information Theory, 2005. ISIT 2005., Adelaide, SA, 2005, pp. 2305-2309. (Year: 2005).*
PCT International Search Report and Written Opinion issued in International Application No. PCT/KR2017/007877, dated Oct. 26, 2017, 18 pages.

* cited by examiner

FIG. 7

$$H = \begin{bmatrix} P^{h^b_{00}} & P^{h^b_{01}} & P^{h^b_{02}} & \cdots & P^{h^b_{0\,nb}} \\ P^{h^b_{10}} & P^{h^b_{11}} & P^{h^b_{12}} & \cdots & P^{h^b_{1\,nb}} \\ \cdots & \cdots & \cdots & \cdots & \cdots \\ P^{h^b_{mb\,0}} & P^{h^b_{mb\,1}} & P^{h^b_{mb\,2}} & \cdots & P^{h^b_{mb\,nb}} \end{bmatrix} = P^{H_b}$$

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix} \xrightarrow{\text{3 right shift}} \begin{bmatrix} 0 & 0 & 0 & 1 \\ 1 & 0 & 0 & 0 \\ 0 & 1 & 0 & 0 \\ 0 & 0 & 1 & 0 \end{bmatrix}$$

METHOD FOR DIVIDING CARRYING BLOCK OF LDPC CODE AND APPARATUS THEREFOR

CROSS-REFERENCE TO RELATED APPLICATIONS

This application is a National Stage application under 35 U.S.C. § 371 of International Application No. PCT/KR2017/007877, filed on Jul. 21, 2017, which claims the benefit of U.S. Application No. 62/412,264, filed on Oct. 24, 2016. The disclosures of the prior applications are incorporated by reference in their entirety.

TECHNICAL FIELD

The present invention relates to a method for segmenting a transport block of a channel code in a wireless communication system, and more particularly, to a method for segmenting a transport block of a Low-Density Parity-Check (LDPC) code and an apparatus therefor.

BACKGROUND ART

Wireless communication systems have been widely deployed in order to provide various types of communication services including voice and data services. In general, a wireless communication system is a multiple access system that can support communication with multiple users by sharing available system resources (a bandwidth, transmission power, etc.). Examples of multiple access systems include code division multiple access (CDMA), frequency division multiple access (FDMA), time division multiple access (TDMA), orthogonal frequency division multiple access (OFDMA), single carrier frequency division multiple access (SC-FDMA), multi carrier frequency division multiple access (MC-FDMA), etc.

Broadcast systems as well as the aforementioned communication systems have necessarily used a channel code. As a general method for configuring a channel code, a transmitting end can encode an input symbol using an encoder and transmitted the encoded symbol. In addition, for example, a receiving end can receive the encoded symbol and decode the received symbol to restore the input symbol. In this case, the size of the input symbol and the size of the encoded symbol can be defined in different ways according to a communication system. For example, in a turbo code for data information used in a long term evolution (LTE) communication system of a 3rd generation partnership project (3GPP), the size of the input symbol is a maximum of 6144 bits and the size of the encoded symbol is 18432 (6144*3) bites. Turbo coding in an LTE communication system may be referred to by the 3GPP technical standard 36.212.

However, the LTE turbo code has characteristics whereby enhancement in performance is slight when a signal to noise ratio (SNR) exceeds a predetermined range even if being increased due to a structure of the code. In this regard, a code with a low error rate as possible can be considered, but in this case, complexity is increased.

A high error rate in a communication system can cause retransmission of unnecessary data and failure in channel reception. In addition, a code with excessively high complexity can cause delay in transmission and reception as well as can increase loads of a base station and a user equipment (UE). In particular, a next-generation communication system that requires rapid transmission and reception of data as possible requires the aforementioned problems. Accordingly, there is a need for a coding method with a low error rate and low complexity.

In particular, the current LTE turbo codes exhibit error floors when the size of information increases. Accordingly, a channel coding method capable of satisfying Ultra Reliable Radio (URR) and Low Latency Radio (LLR) is required.

DISCLOSURE

Technical Problem

An object of the present invention devised to solve the above-mentioned problems lies on a method for segmenting a transport block for a high throughput shifting network.

A further object of the present invention is to provide an apparatus for supporting the methods.

It will be appreciated by persons skilled in the art that the objects that could be achieved with the present invention are not limited to what has been particularly described hereinabove and the above and other objects that the present invention could achieve will be more clearly understood from the following detailed description.

Technical Solution

The object of the present invention can be achieved by providing a method for segmenting a transport block of a Low Density Parity Check (LDPC) code by a terminal having a $2^n$ shifting network, the method including determining the number of code blocks according to a maximum lifting value for the transport block among a plurality of predetermined lifting values under a predetermined condition, the plurality of preset lifting values taking a form of $A \times 2^n$, where A is an integer greater than or equal to 1 and n is an integer greater than or equal to 0, selecting at least one lifting value from among the plurality of preset lifting values for a first length obtained by subtracting a length corresponding to the determined number of code blocks from the transport block, segmenting the transport block into a plurality of code blocks based on the selected at least one lifting value and the determined number of code blocks, and transmitting the segmenting code blocks.

In addition, the preconfigured condition may include determining the number of code blocks according to the maximum lifting value such that the first length is greater than a length of the code blocks according to the maximum lifting value and less than twice the length of the code blocks according to the maximum lifting value, wherein the selecting may include selecting a greatest lifting value from among lifting values having a minimum information bit length less than the first length among the plurality of preset lifting values until a sum of a length of a code block corresponding to the at least one lifting value and a length corresponding to the determined number of code blocks according to the maximum lifting value exceeds a length of the transport block, and repeating update of the first length by subtracting a minimum information bit length corresponding to the selected lifting value from the first length.

The minimum information bit length may be a length obtained by applying maximum shortening to an information bit length according to a corresponding lifting value.

The method may further include performing shortening on at least one code block having a maximum length among the plurality of code blocks.

The plurality of code blocks may include a plurality of maximum length code blocks, wherein shortening of the same scale may be performed on the plurality of maximum length code blocks.

The method may further include transmitting information about the number of the code blocks.

The method may further include transmitting information about the selected at least one lifting value.

In another aspect of the present invention, provided herein is a terminal of a wireless communication system, including a transceiver configured to transmit and receive signals, a memory, a processor configured to control the transceiver and the memory, wherein the processor is configured to segment a transport block of a Low Density Parity Check (LDPC) code using a $2^n$ shifting network, wherein the processor is further configured to determine the number of code blocks according to a maximum lifting value for the transport block among a plurality of predetermined lifting values under a predetermined condition, select at least one lifting value from among the plurality of preset lifting values for a first length obtained by subtracting a length corresponding to the determined number of code blocks from the transport block, segment the transport block into a plurality of code blocks based on the selected at least one lifting value and the determined number of code blocks, and transmit the segmenting code blocks, wherein the preconfigured condition includes determining the number of code blocks according to the maximum lifting value such that the first length is greater than a length of the code blocks according to the maximum lifting value and less than twice the length of the code blocks according to the maximum lifting value, wherein the at least one lifting value is selected by selecting a greatest lifting value from among lifting values having a minimum information bit length less than the first length among the plurality of preset lifting values until a sum of a length of a code block corresponding to the at least one lifting value and a length corresponding to the determined number of code blocks according to the maximum lifting value exceeds a length of the transport block, and repeating update of the first length by subtracting a minimum information bit length corresponding to the selected lifting value from the first length, and wherein the plurality of preset lifting values takes a form of $A \times 2^n$, where A may be an integer greater than or equal to 1 and n may be an integer greater than or equal to 0.

The above-mentioned aspects of the present invention are merely a part of preferred embodiments of the present invention. Those skilled in the art will derive and understand various embodiments reflecting the technical features of the present invention from the following detailed description of the present invention.

Advantageous Effects

According to embodiments of the present invention, the following effects are obtained.

The method for segmenting a transport block of an LDPC code according to the present invention may increase the throughput by using a single shifting value.

In addition, the method for segmenting a transport block of an LDPC code according to the present invention may minimize shortening of a minimum-length code block through shortening of a maximum-length code block.

Further, the method for segmenting a transport block of an LDPC code according to the present invention may prevent performance deterioration by increasing the length of the minimum-length code block.

It will be appreciated by persons skilled in the art that the effects that can be achieved through the present invention are not limited to what has been particularly described hereinabove and other advantages of the present invention will be more clearly understood from the following detailed description.

DESCRIPTION OF DRAWINGS

The accompanying drawings, which are included to provide a further understanding of the invention and are incorporated in and constitute a part of this application, illustrate embodiment(s) of the invention and together with the description serve to explain the principle of the invention:

FIG. 7 illustrates an example of a structured parity check matrix;

FIG. 8 illustrates an example of a model matrix;

BEST MODE

The following descriptions are usable for various wireless access systems including CDMA (code division multiple access), FDMA (frequency division multiple access), TDMA (time division multiple access), OFDMA (orthogonal frequency division multiple access), SC-FDMA (single carrier frequency division multiple access) and the like. CDMA can be implemented by such a radio technology as UTRA (universal terrestrial radio access), CDMA 2000 and the like. TDMA can be implemented with such a radio technology as GSM/GPRS/EDGE (Global System for Mobile communications)/General Packet Radio Service/Enhanced Data Rates for GSM Evolution). OFDMA can be implemented with such a radio technology as IEEE 802.11 (Wi-Fi), IEEE 802.16 (WiMAX), IEEE 802.20, E-UTRA (Evolved UTRA), etc. UTRA is a part of UMTS (Universal Mobile Telecommunications System). 3GPP (3rd Generation Partnership Project) LTE (long term evolution) is a part of E-UMTS (Evolved UMTS) that uses E-UTRA. The 3GPP LTE employs OFDMA in DL and SC-FDMA in UL. LTE-A (LTE-Advanced) is an evolved version of 3GPP LTE.

For the sake of clarity, 3GPP LTE/LTE-A is mainly described, but the technical idea of the present invention is not limited thereto. Specific terms used for the embodiments of the present invention are provided to help the understanding of the present invention. These specific terms may be replaced with other terms within the scope and spirit of the present invention.

Figure 1:
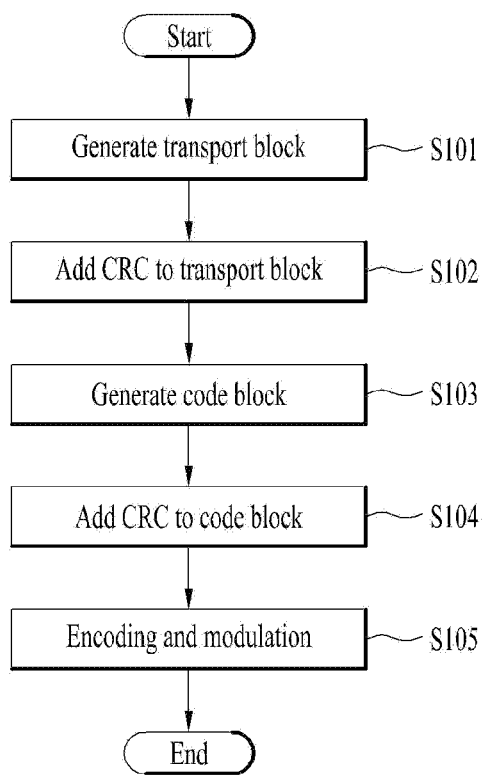
FIG. 1 illustrates a coding procedure according to an example.

FIG. 1 illustrates a coding procedure according to an example.

The coding procedure as shown in FIG. 1 may be applied to many channel codes including a turbo code used in the LTE communication system. Hereinafter, for simplicity, the coding procedure will be described based on terminology according to LTE communication system standards.

In the example of FIG. 1, the transmitting end may generate a transport block (TB) (S101). In addition, the transmitting end adds a CRC bit for the transport block to the transport block (S102). In addition, the transmitting end may generate code blocks from the transport block to which the CRC bit is added (S103). For example, the transmitting end may segment the transport block into code blocks based on the input size of the encoder. Further, the transmitting end may add a CRC bit for each segmented code block (S104). In this case, for example, the code block and the code block CRC bits may be configured to have a size of 6144 bits. The transmitting end may perform encoding and modulation on each block including code blocks and CRC bits (S105). For example, turbo coding may be applied as described above.

The decoding procedure may be performed in the reverse order of the coding procedure of FIG. 1. For example, the receiving end may decode each code block using a decoder corresponding to each encoder, finally construct one transport block, and then check whether the transport block has passed the CRC.

For example, the size of the input symbols may be different from that of the transport block (TB) from the Media Access Control (MAC) layer. If the size of the transport block is larger than the maximum input symbol size of the turbo code, the transport block may be segmented into a plurality of code blocks (CB). According to the LTE communication system standard, the size of the code blocks may be equal to a result obtained by subtracting the CRC (Cyclic Redundancy Check) bits from 6144 bits. An input symbol of a turbo code may be defined as data including code blocks and CRC or data including a transport block (wherein the size of the transport block is less than, for example, 6144 bits) and CRC. The size of the CRC bits is very small (e.g., a maximum of 24 bits) compared to 6144 bits. Accordingly, in the following description, unless otherwise defined, a code block may refer to the code block itself or a CRC bit corresponding to the code block, and a transport block refers to the transport block itself or CRC bits corresponding to the transport block.

Figure 2:
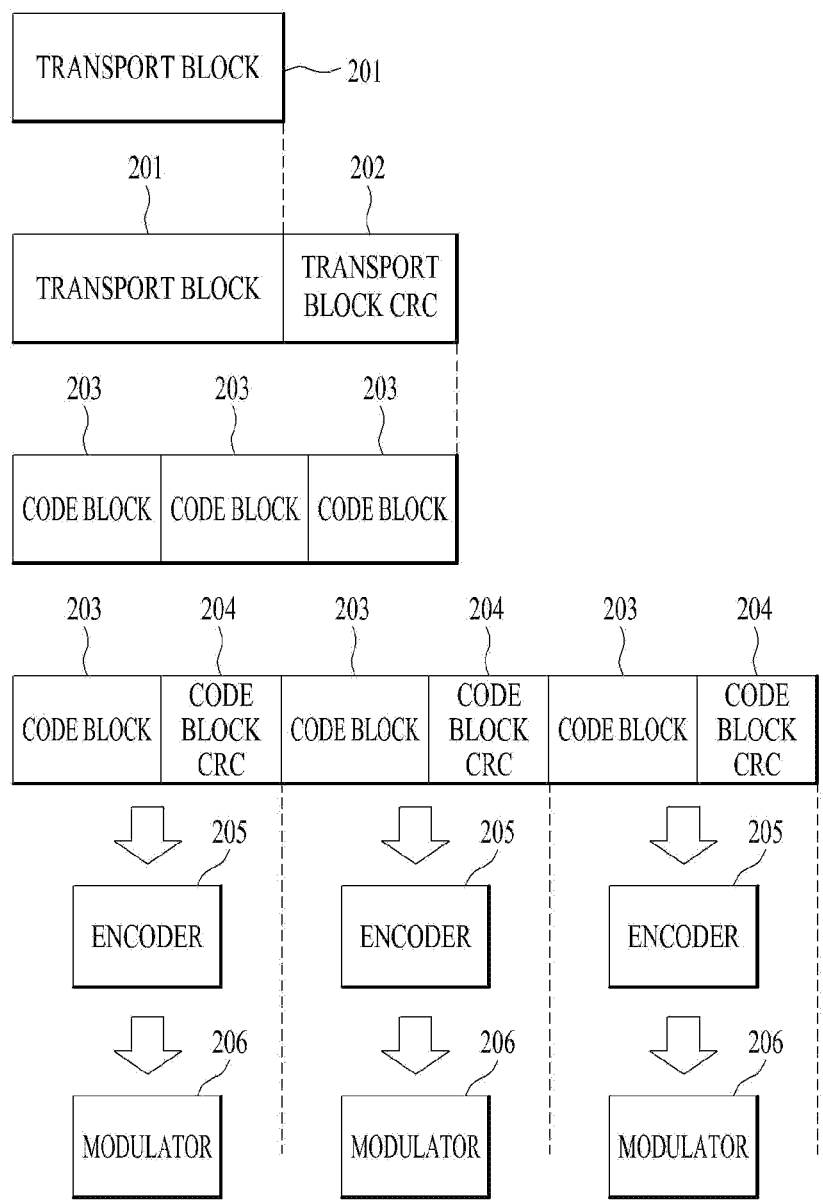
FIG. 2 illustrates a procedure of encoding a transport block according to an example.

FIG. 2 illustrates a procedure of encoding a transport block according to an example.

FIG. 2 illustrates a procedure of encoding a transport block 201 corresponding to the coding procedure described above with reference to FIG. 1. First, transport block CRC 202 is added to the transport block 201. The transport block CRC 202 may be used for identification of the transport block 201 in the decoding procedure. The transport block 201 and the transport block CRC 202 are then segmented into three code blocks 203. While the transport block 201 is segmented into three code blocks 203 in this embodiment, the transport block 201 may be segmented into a plurality of code blocks based on the input size of the encoder 205.

Code block CRC 204 is added to each of the code blocks 203. The code block CRC 204 may be used for identification of the code block 203 at the receiving end. The code blocks 203 and the code block CRC 204 may be coded via the encoder 205 and the modulator 206.

Figure 3:
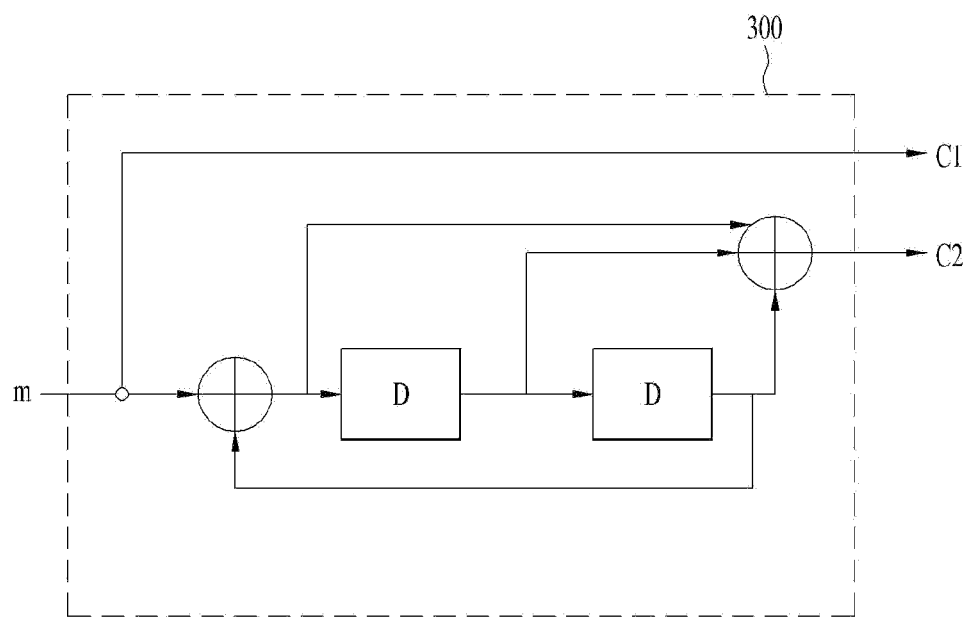
FIG. 3 illustrates a recursive systematic convolutional (RSC) encoder according to an example.

FIG. 3 illustrates a recursive systematic convolutional (RSC) encoder according to an example.

An RSC encoder 300 of FIG. 3 may be used for turbo coding. In FIG. 3, m denotes input data, C1 denotes a systematic bit string, and C2 denotes a coded bit string. Here, the RSC encoder 300 has a code rate of 1/2.

The RSC encoder 300 may be configured by feeding back a coded output to the input of a non-recursive non-systematic convolutional encoder. In the embodiment of FIG. 3, the encoder 300 includes two delay units 301, 302. The value D of the delay units 301 and 302 may be determined according to a coding scheme. The delay unit 301, 302 may include a memory or a shift register.

Figure 4:
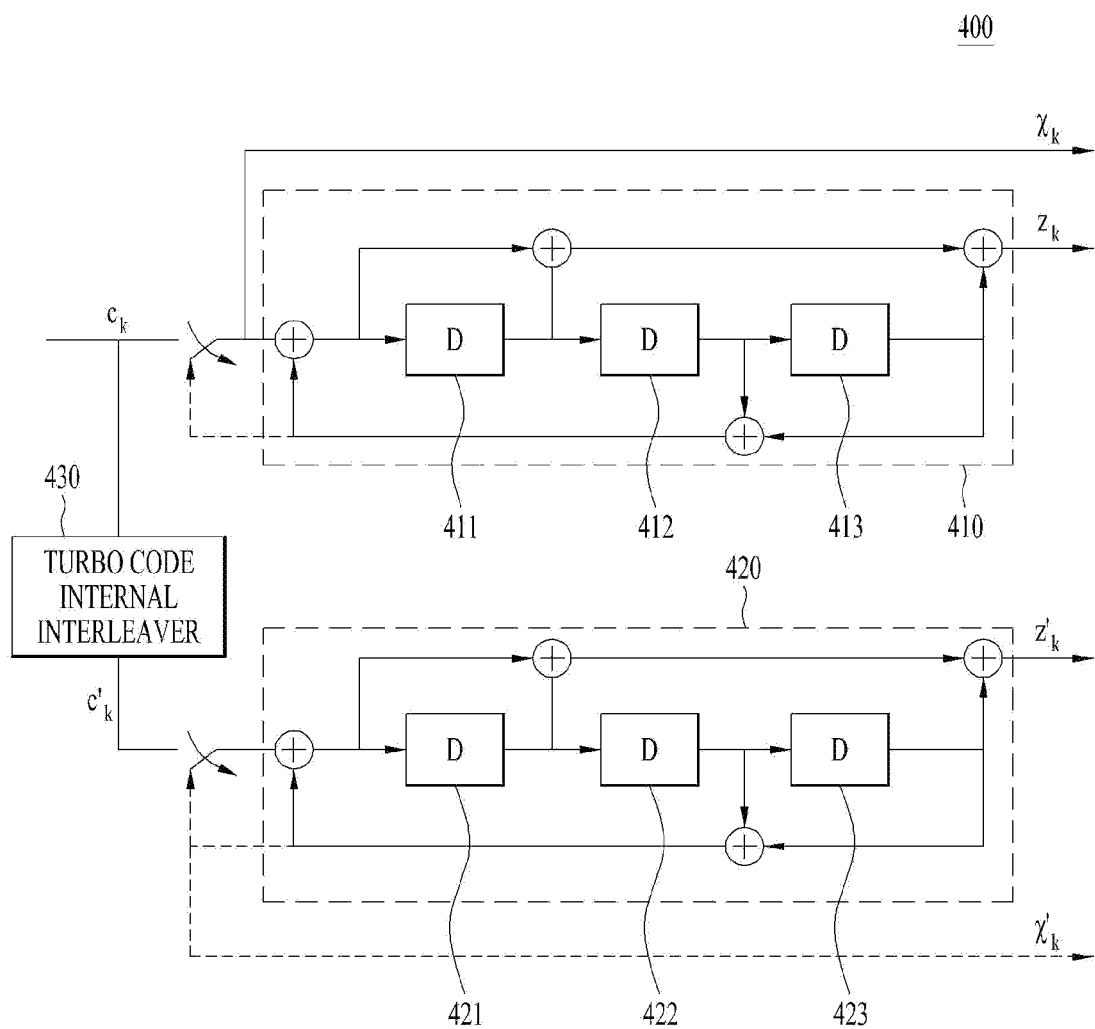
FIG. 4 illustrates a long term evolution (LTE) turbo encoder.

FIG. 4 illustrates an LTE turbo encoder.

The coding scheme of the LTE turbo encoder 400 is a parallel concatenated convolutional code (PCCC) having two 8-state constituent encoders 410 and 420 and a turbo code internal interleaver 430.

In FIG. 4, the turbo encoder 400 includes a first constituent encoder 410, a second element encoder 420, and a turbo code internal interleaver 430. The first constituent encoder 410 and the second constituent encoder 420 are 8-state constituent encoders. The first constituent encoder 410 and the second constituent encoder 420 are configured in a structure similar to that of the RSC encoder of FIG. 3. Each of the first constituent encoder 410 and the second constituent encoder 420 includes three delay units 411, 412 and 413, 421, 422 and 423.

In FIG. 4, D is a value determined according to a coding scheme and $c_k$ is an input to the turbo encoder 400. The outputs from the first constituent encoder 410 and the second constituent encoder 420 are denoted by a and $z'_k$, respectively. The value output from the turbo code internal interleaver 430 is denoted by $c'_k$. Generally, the delay units 411, 412, 413, 421, 422, 423 may delay the input values by one clock. However, the delay units 411, 412, 413, 421, 422, 423 may be configured to delay the input values by more than one clock depending on the internal configuration thereof. The delay unit 411, 412, 413, 421, 422, 423 may include a shift register, delay an input bit by a predetermined clock, and then output the input bit to the next delay unit 411, 412, 413, 421, 422, 423.

The turbo code internal interleaver 430 may lower the influence of a burst error that may occur when a signal is transmitted over a radio channel. For example, the turbo code internal interleaver 430 may be a quadratic polynomial permutation (QPP) interleaver.

The turbo code is a high performance forward error correction (FEC) code and is used in the LTE communication system. For example, a data block coded by the turbo code may include three sub-blocks. One of the sub-blocks may correspond to m-bit payload data. Another subblock may be configured with n/2 bits, i.e., parity bits for the payload, calculated using a recursive systematic convolution (RSC) code. The other subblock may be configured with n/2 bits, i.e., parity bits for permutation of payload data, calculated using an RSC code. For example, the above-described permutation may be performed by an interleaver. Thus, two sub-blocks having different parity bits and the payload may constitute one block. For example, if m is equal to n/2, one block has a code rate of 1/3.

In the first constituent encoder 410, the procedure in which the input $c_k$ reaches the coded bit $z_k$ may be divided into two paths. The two paths are a first path connected from an input terminal to an output terminal without output feedback and a second path fed back from an input terminal to the input terminal.

In the first path, an input $c_k$ passed through the delay unit 411, and an input $c_k$ passed through the delay units 411, 412, and 413 are applied to the output terminal. The relationship between the input terminal and the output terminal for the first path may be expressed by a polynomial. The polynomial for the first path is called a forward generator polynomial and may be expressed as g1 in the following equation.

$$g1(D)=1+D+D^3 \quad \text{[Equation 1]}$$

In the second path, an input $c_k$, an input $c_k$ passed through the delay units 411 and 412, and an input $c_k$ passed through the delay units 411, 412 and 413 are fed back to the input terminal. The polynomial for the second path is called a recursive generator polynomial and may be expressed as g0 in the following equation.

$$g0(D)=1+D^2+D^3 \quad \text{[Equation 2]}$$

In [Equation 1] and [Equation 2], "+" denotes exclusive OR (XOR), and 1 denotes that the input undergoes 0 delay. In addition, $D^n$ denotes that the input undergoes n delays.

Figure 5:
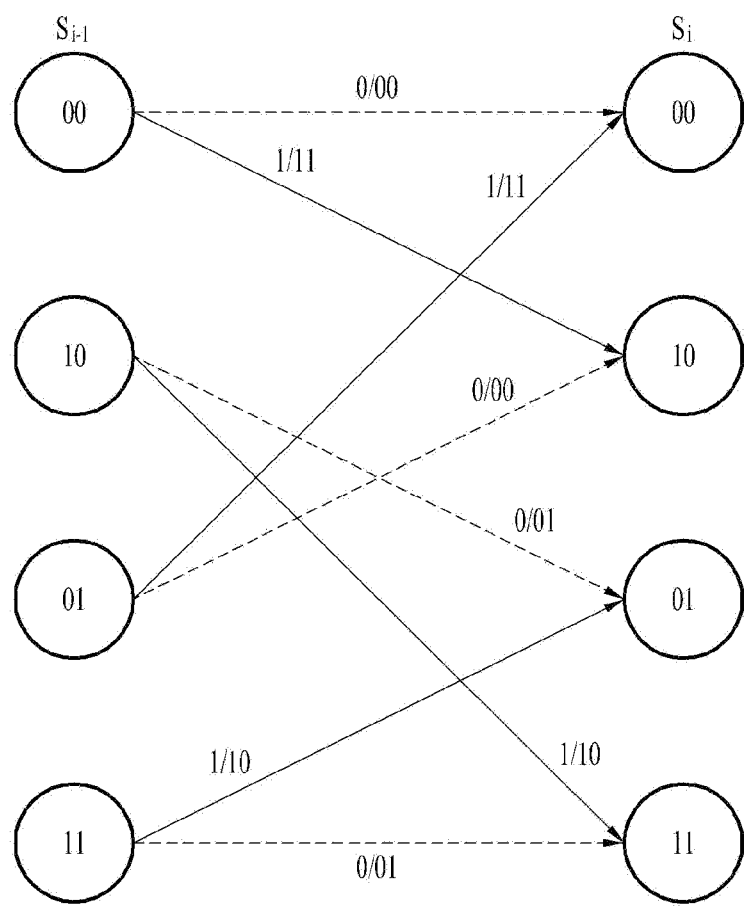
FIG. 5 illustrates an example of a trellis according to an RSC encoder.

FIG. 5 illustrates an example of a trellis according to an RSC encoder.

FIG. 5 shows the structure of the trellis of the RSC encoder shown in FIG. 3. In FIG. 5, $S_i$ denotes the state of the ith input data. In FIG. 5, each circle represents a corresponding node. In addition, a line connected between nodes represents a branch. The solid line represents a branch for the input value of 1, and the dotted line represents a branch for the input value of 0. The value on a branch is indicated by m/C1C2 (input value/systematic bit, coded bit). The trellis may also have a state that is exponentially proportional to the number of memories of the encoder. For example, if the number of memories included in the encoder is a, $2^a$ states may be included in the trellis.

The trellis is a state machine that shows a possible state transition of an encoder between two states. A convolutional encoder such as the RSC encoder may perform coding according to a trellis diagram. The codeword coded by the RSC encoder may be decoded according to an algorithm based on the trellis structure. For example, the Viterbi or BCJR (Bahl, Cocke, Jelinek and Raviv) algorithm may be used.

Figure 6:
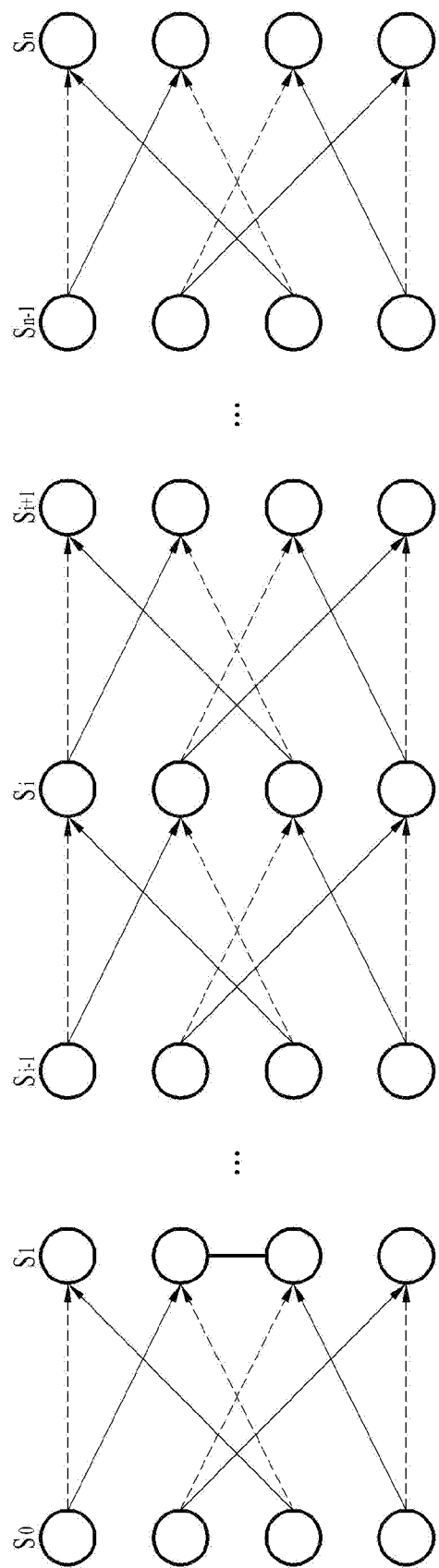
FIG. 6 illustrates an example of a trellis structure.

FIG. 6 illustrates an example of a trellis structure.

In FIG. 6, n denotes the length of a codeword. Typically, the trellis may be terminated by adding an additional bit after an input sequence. In general, a sequence configured as a sequence of 0 is referred to as a tail bit. The tail bit causes the nodes in one state of the trellis to have 0 as a value to terminate the trellis.

In FIG. 6, the length of the codeword may be determined in consideration of the length k of the input data and the length t of the tail bits. For example, if the code rate is R, the length n of the codeword may be (k+t)/R. In general, a length by which all delay units (e.g., memories) of the encoder may be reset may be determined as the length t of the tail bits. For example, the RSC encoder of FIG. 3 may use a total of 2 bits as the tail bits. The turbo encoder for LTE communication as shown in FIG. 4 may use 3 bits as the tail bits.

The length of the tail bits is shorter than the length of the input data. As described above, since the length of the codeword is associated with the length of the tail bits, loss of the code rate may occur due to the tail bits when the length of the codeword is limited. However, despite the loss of the code rate due to the tail bits, the trellis is terminated using the tail bits in many cases. This is because this method lowers computational complexity and exhibits excellent error correction performance.

The puncturing code refers to a method of puncturing a part of a codeword. In the puncturing code, a part of a codeword is punctured such that the part of the codeword is not transmitted. For example, the puncturing code may be used to lower the code rate loss caused by addition of tail bits. In this case, the receiving end may perform decoding using the trellis corresponding to the sum of the length k of the input data and the length t of the tail bits. That is, the receiving end may perform decoding on the assumption that the non-punctured codeword is received. In this case, the receiving end may consider that there is no input value for the branch from a node corresponding to the punctured bit (i.e., the bit not transmitted from the transmitting end). That is, for the branches of the node, the input data is assumed to be 0 or 1 with the same probability.

As described above with reference to FIG. 1, the CRC for a code block is added to the code block. The CRC may be determined as a remainder obtained by dividing data to be transmitted by a predetermined check value. In general, the CRC can be added to the end portion of transmitted data. The receiving end may compare the CRC with a remainder obtained by dividing received data by a predetermined check value. Alternatively, the receiving end may determine whether a remainder obtained by dividing total received data including the CRC by the check value is 0.

When a transport block size is 6144 bits, the CRC may have a maximum size of 24 bits. Thus, a code block size is determined based on the remaining bits except the CRC bits.

The receiving end may perform decoding on each code block. Thereafter, the receiving end configures a transport block based on the code block and then checks CRC for the transport block to determine whether the decoding is successfully performed. In the current LTE system, a code block CRC is used for early decoding termination. For example, if the receiving end fails to check CRC for a single code block, the receiving end may transmit NACK (Negative ACKnowledgement) to the transmitting end without decoding of remaining code blocks.

When receiving the NACK, the transmitting end may retransmit at least part of the transmitted data. For instance, the transmitting end may retransmit a transport block or at least one code block. For example, if the entirety of the transport block is retransmitted, a large amount of radio resources may be used for the retransmission. In addition, if the receiving end intends to transmit NACK due to a code block CRC failure, the receiving end may transmit information (e.g., an index of the code block) of the code block where the CRC failure occurs to the transmitting end together. Moreover, the transmitting end may retransmit the code block where the CRC failure occurs using the code block information in order to improve radio resource efficiency. However, as the number of code blocks increases, the amount of data required for feeding back information of the code blocks (e.g., code block indices) also increases.

In the LTE communication system, the receiving end uses ACK/NACK signals to inform the transmitting end whether the receiving end receives data successfully. In frequency division duplex (FDD), ACK/NACK for data received in an ith subframe is transmitted in an (i+4)th subframe. If the NACK is transmitted in the (i+4)th subframe, retransmission may be performed on an (i+8)th subframe. This is the result obtained by considering a time required for processing the transport block and a time required for generating the ACK/NACK. Specifically, a process in which a channel code for the transport block is fairly time consuming. In time division duplex (TDD), the ACK/NACK and a subframe for the retransmission may be determined based on the time required for processing the transport block, the time required for generating the ACK/NACK, and uplink subframe allocation (e.g., TDD uplink/downlink configuration). In addition, ACK/NACK bundling and multiplexing can also be used.

As described above, in the case of the turbo code, if an SNR exceeds a predetermined range, its error correction rate cannot be improved significantly. In this regard, a low-density parity-check (LDPC) code has been proposed as an alternative of the turbo code. The LDPC code, which corresponds to a linear block code, has been used in IEEE 802.11n, 802.11ac, and digital video broadcasting (DVB). The LDPC code may include a generation matrix and a parity check matrix. Data in the LDPC code may be encoded by a product of message bits and the generation matrix. In the communication standards using the LDPC code, the generation matrix may be replaced with the parity check matrix. For example, data encoding can be performed using the parity check matrix.

A linear block code can be generated based on a generation matrix G and a parity check matrix H. The linear block code is configured such that it satisfies the condition of $Hc^t=0$ with respect to every codeword c. Similar to other linear block codes, the LDPC code can be decoded by checking whether a value obtained by multiplying the parity check matrix H and the codeword c is 0. In other words, if a product (i.e., $Hc^t$) of a transposed matrix of the codeword c and the parity check matrix H is 0, it may be determined that the LDPC code is decoded.

In the case of the LDPC code, most elements of the parity check matrix are set to 0 and the number of elements that are not 0 is smaller than a code length. Thus, the LDPC code can be repeatedly decoded on the basis of probability. According to the initially proposed LDPC code, the parity check matrix is defined to have a non-systematic form and a small weight is equally applied to a row and a column of the parity check matrix. Here, the weight may mean the number of 1's included in a row or column.

As described above, the number of non-zero elements in the parity check matrix H of the LDPC code is relatively small. Thus, the LDPC code has low decoding complexity and shows performance close to Shannon's theoretical limit. Due to high error correction performance and low decoding complexity, the LDPC code is considered to be suitable for high-speed wireless communication.

Hereinafter, a structured LDPC code will be described.

Figures 7, 8:
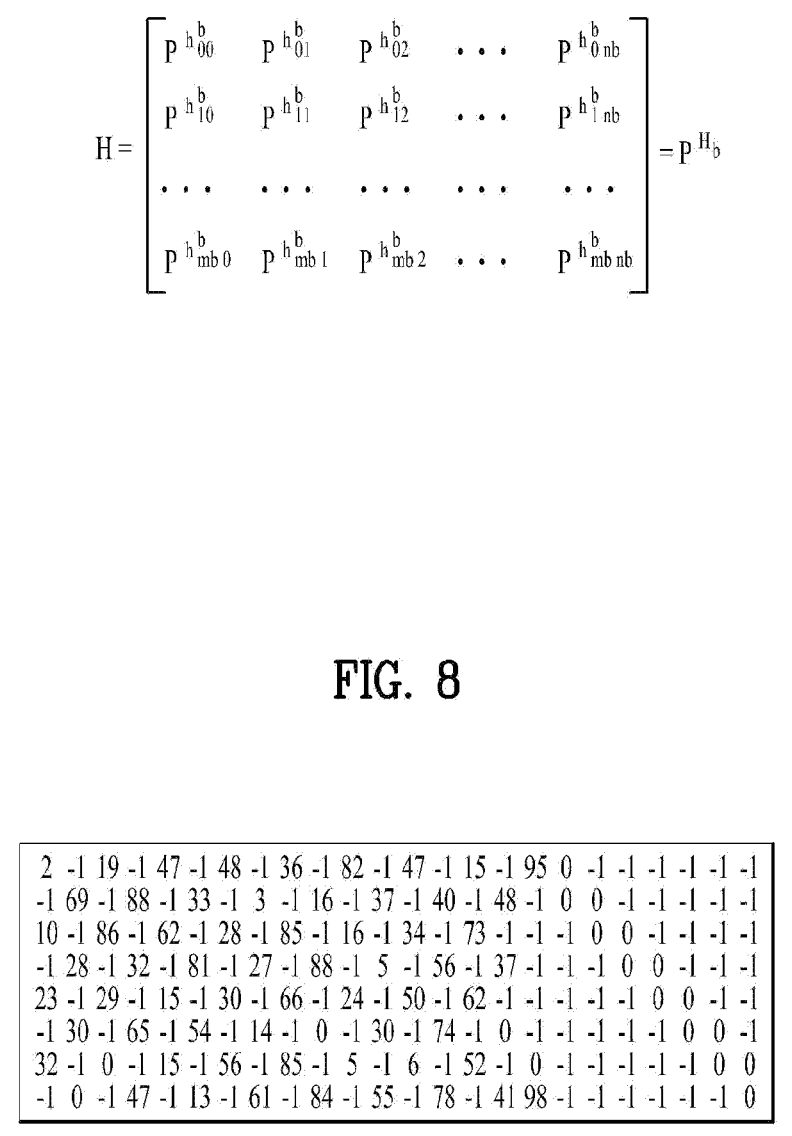

The parity check matrix H can be used to generate the LDPC code as described above. The matrix H is composed of many 0's and a few 0's. The size of the matrix H may be greater than 105 bits and thus, a large memory may be required to represent the matrix H. According to the structure LDPC code, elements of the matrix H can be represented as a fixed size of sub-blocks as shown in FIG. 7. In FIG. 7, each element of the matrix H denotes a single sub-block.

According to IEEE 802.16e standard, the size of the memory for representing the matrix H can be reduced by representing the sub-block as a single integer index. In this case, each sub-block may be, for example, a permutation matrix having a fixed size.

FIG. 8 illustrates an example of a model matrix.

Specifically, FIG. 8 shows when a codeword size is 2304 and a code rate is 2/3, the model matrix used for encoding/decoding the LDPC code, which is defined in IEEE 802.16e standard. In the following description, the model matrix may mean a parity check matrix composed of at least one sub-block and each sub-block may mean a shift number. In addition, the model matrix can be extended to the parity check matrix according to a method proposed in the present invention. Therefore, encoding and decoding based on a specific model matrix may imply encoding and decoding based on the parity check matrix generated by extending the corresponding model matrix.

In FIG. 8, index '−1' indicates a predetermined size of zero matrix and index '0' indicates a predetermined size of identity matrix. In addition, positive integer indices except the indices '−1' and '0' indicate shift numbers. For example, a sub-block expressed as index '1' may mean a matrix obtained by shifting the identity matrix once in a specific direction.

Figures 9, 10:
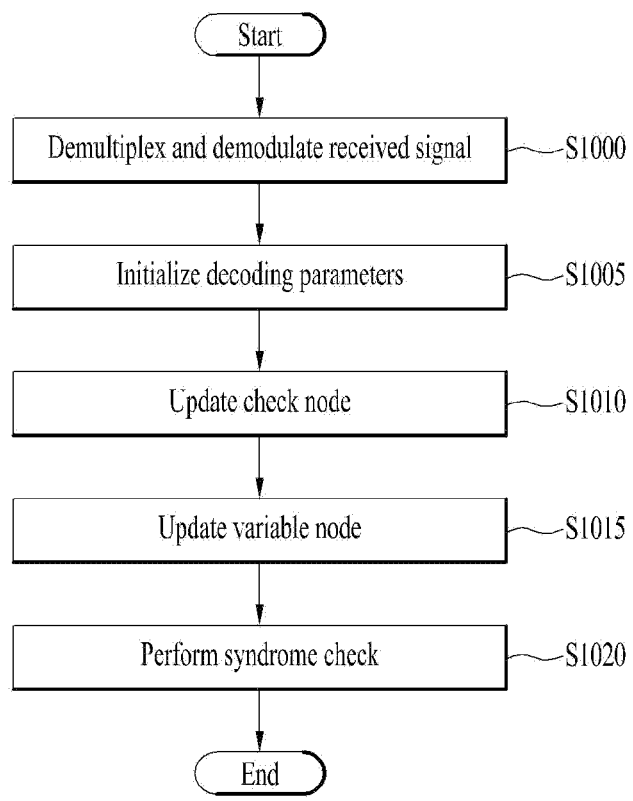
FIG. 9 is a diagram for explaining conversion of a matrix according to a shift number.
FIG. 10 is a flowchart illustrating an example of a method for decoding an LDPC code.

FIG. 9 is a diagram for explaining conversion of a matrix according to a shift number.

Specifically, FIG. 9 shows a case in which a sub-block has a size of 4 by 4. Referring to FIG. 9, the sub-block is shifted by three times to the right from with reference to the identity matrix. In this case, the sub-block of the parity check matrix of the structured LDPC code can be expressed using integer index '3'.

In general, to perform LDPC code encoding, the generation matrix G is generated from the parity check matrix H and information bits are encoded using the generation matrix G. To this end, Gaussian Reduction is performed on the parity check matrix H and then a matrix in the form of $[P^T:I]$ is generated. If the number of information bits is k and a codeword size is n, a matrix P may have k rows and (n-k) columns and a matrix I may be an identity matrix with a size of k.

If the parity check matrix has the form of $[P^T:I]$, the generation matrix G may have the form of $[I:P^T]$. In addition, if k-bits of information is encoded, the encoded information bits may be expressed as a matrix x with a size of 1 by k. In this case, the codeword c is represented as xG and the xG has the form of [x:xP], where x corresponds to an information part (or systematic part) and xP corresponds to a parity part.

Alternatively, by designing the matrix H to have a specific structure instead of using Gaussian Reduction, the information bits can be directly encoded from the matrix H without generating the matrix G. From the structures of the matrices H and G, it can be seen that a product of the matrix G and a transposed matrix of the matrix H is 0. Based on such features and a relationship between the information bits and codeword, parity bits can be added to the end of the information bits, thereby obtaining the codeword.

FIG. 10 is a flowchart illustrating an example of a method for decoding an LDPC code.

In the communication system, while encoded data is transmitted over a radio channel, noise is included in the data. Considering this fact, the codeword c can be expressed as a codeword c' from the perspective of the receiving end. The receiving end performs demultiplexing and demodulation on a received signal (S1000) and then initializes decoding parameters (S1005). Subsequently, the receiving end updates a check node and a variable node (S1010 and S1015) and then performs a syndrome check (S1020). That is, the receiving end can terminate a decoding procedure is terminated after checking whether $c'H^T$ is 0 or not. If the $c'H^T$ is 0, first k bits of the codeword c' can be determined as information bits x. Otherwise, if the $c'H^T$ is not 0, information bits x can be restored by finding a codeword c' that satisfies the condition of $c'H^T=0$ based on a decoding scheme such as a sum-product algorithm.

Figure 11:
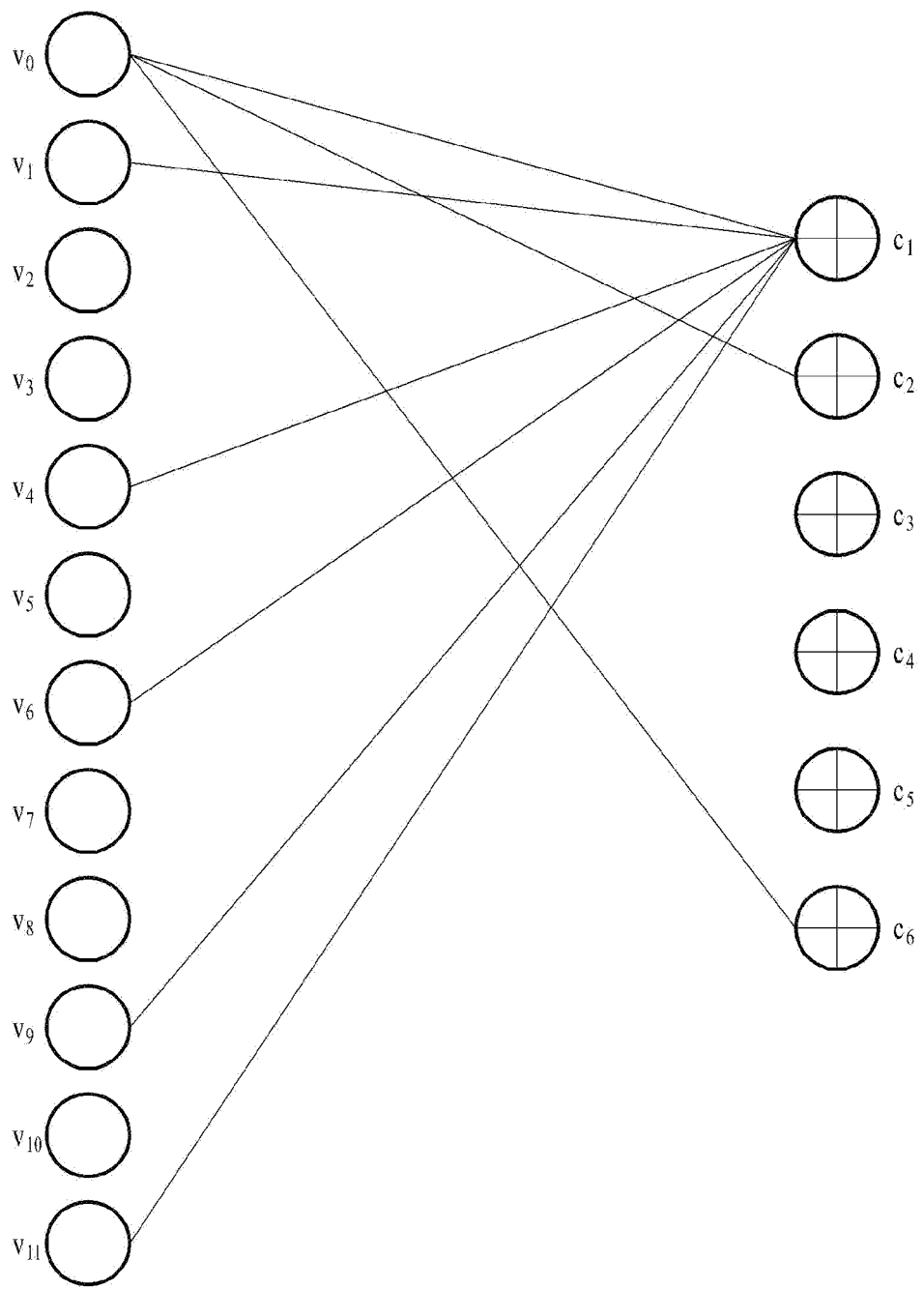
FIG. 11 illustrates an example of a bipartite graph.

FIG. 11 illustrates an example of a bipartite graph

In FIG. 11, nodes ($v_0, v_1, \ldots, v_{11}$) on the left side indicate variable nodes and nodes ($c_1, c_2, \ldots, c_6$) on the right side indicate check nodes. For convenience of description, FIG. 11 shows nodes connected to a variable node $v_0$ and a check node $c_1$. A connection line shown in the bipartite graphs of FIG. 11 can be referred to as an edge. In addition, the bipartite graph of FIG. 11 may be generated from the $Hc^t$. Thus, in FIG. 11, edges from the variable node $v_0$ may correspond to the first column of the parity check matrix H and edges from the check node $c_1$ may correspond to the first row of the matrix H.

Since the product of the parity check matrix H and the transposed matrix of the codeword c should be 0 for successful decoding as described above, values of variable nodes connected to a single check node should also be 0. Thus, in the case of FIG. 11, the exclusive OR (XOR) of variable nodes ($v_0, v_1, v_4, v_6, v_9$, and $v_{11}$) connected to the check node $c_1$ should be 0. That is, the syndrome check means to check whether the XOR of variable nodes connected to each check node is 0.

In an enhanced mobile broadband (eMBB) communication environment, LDPC codes may be used. For example, LDPC codes may be used for a data channel. In this regard, a method for decoding an LDPC code using the syndrome check instead of the CRC has been proposed. However, when the syndrome check is performed for each iterative decoding operation, a memory in which a log likelihood ratio for variable nodes is stored needs to be read for the syndrome check. Thereby, power consumption and delay may increase due to the reading of the memory.

The sum-product algorithm is used as a standard decoding algorithm for capacity-approaching codes (e.g., turbo code or LDPC code). As a decoding method using the sum-product algorithm, a belief propagation algorithm is used. In a layered belief propagation algorithm, operations for check nodes and variable nodes of the sum-product algorithm are sequentially processed for decoding of the LDPC code. Accordingly, in the layered belief propagation algorithm, the probability value of the first variable node is transmitted to the check nodes connected to the first variable node, and the additional information value calculated based on the probability value transmitted to each check node is transmitted to the variable nodes connected to each check node. The other variable nodes are sequentially updated based on the transmitted additional information value. Thereby, the probability values of all the variable nodes may be updated.

Due to the sequential update of the variable nodes in the layered belief propagation algorithm, a specific variable node may be updated using the probability values of other variable nodes that have already been updated. However, for the decoding using the layered belief propagation algorithm, the time required for the decoding is increased according to the length of the codeword over the case where the flooding belief propagation algorithm is used. For example, the decoding time may be increased by N times the length of the codeword.

Figure 12:
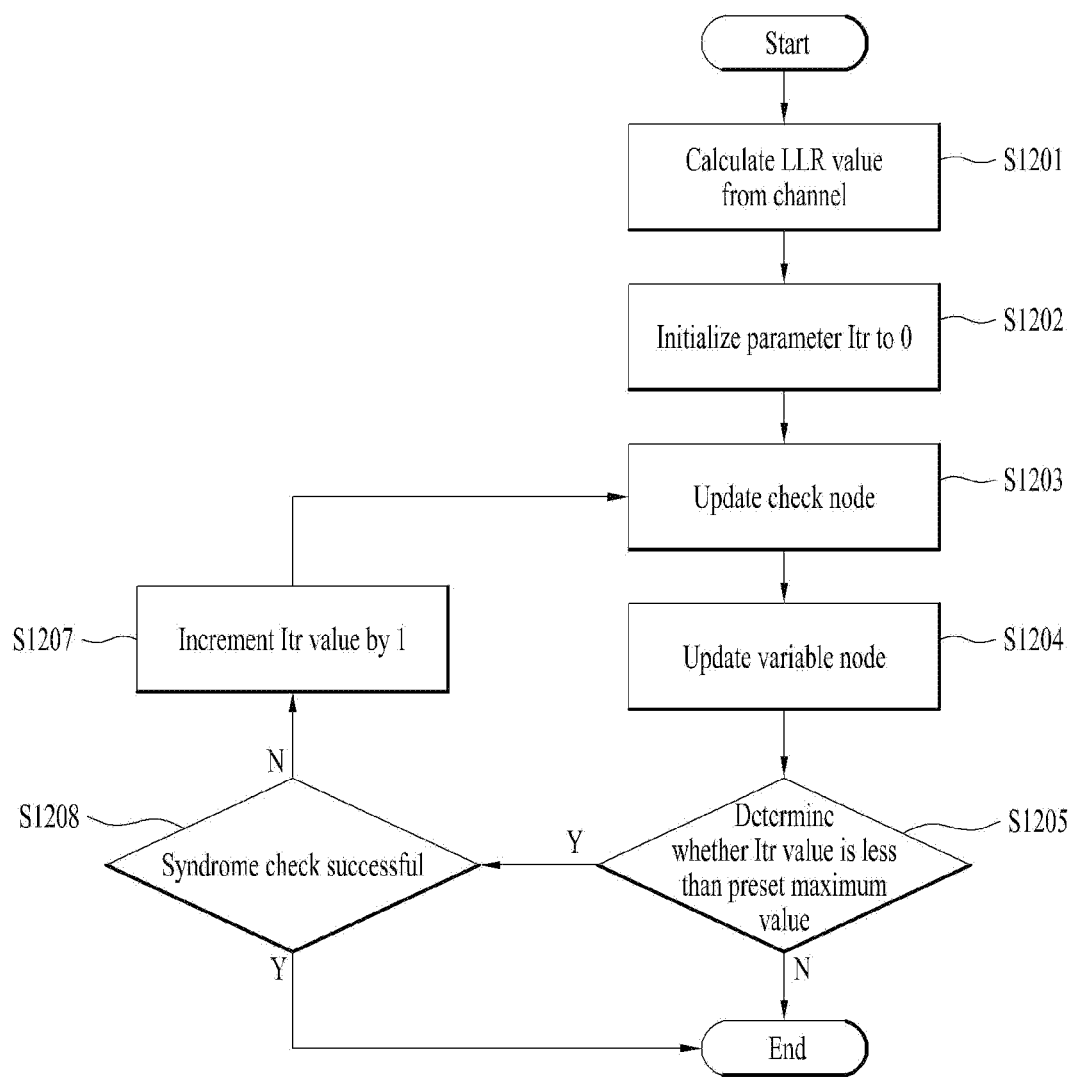
FIG. 12 illustrates an example of a method for decoding an LDPC code using a syndrome check.

FIG. 12 is a flowchart illustrating an example of a method for decoding an LDPC code using syndrome check.

The receiving end calculates a log likelihood ratio (LLR) value from a channel (S1201). For example, the receiving end may calculate the LLR value of a received input signal or codeword. Although not shown in FIG. 12, the receiving end may also initialize the variable nodes using the LLR value. Further, the receiving end initializes the parameter Itr to 0 (S1202). The parameter Itr is a parameter indicating the number of iterations. The receiving end updates each check node based on the values of the variable nodes (S1203). For example, each check node may be updated based on the values of variable nodes associated with each check node by a parity check matrix. In addition, the receiving end may update the variable nodes (S1204). For example, the receiving end may update each variable node based on the values of the check nodes (e.g., the LLR values of the check nodes) associated with each variable node by the parity check matrix.

The receiving end determines whether the value of Itr is less than a preset maximum value (S1205). When the value of Itr is less than the maximum value, the receiving end may determine whether syndrome check is successful (S1206). For example, the receiving end may perform the syndrome check on the check nodes using a parity check matrix. For example, the syndrome check may be performed according to the method described above in relation to FIGS. 9 to 11. If the syndrome check is successful, the decoding may be considered successful. Thus, the decoding may be terminated. However, if the syndrome check fails, the receiving end may increment the value of Itr by 1 and repeat steps S1203 to S1205. However, if the number of iterations reaches a preset maximum value, the receiving end may consider the decoding unsuccessful. For example, when the decoding fails, the receiving end may terminate the decoding and transmit a negative acknowledgment (NACK) and/or a retransmission request to the transmitting end.

In order to obtain excellent performance of the LDPC code, a parity check matrix (or generation matrix) may be arbitrarily configured. In addition, the performance of the LDPC code may be improved as the length of a block increases. Further, in the decoding, the performance of the LDPC code may be improved through an optimal decoding method. However, due to the decoding complexity of the optimal decoding, a belief propagation algorithm is used to decode the LDPC code. Although the arbitrarily generated parity check matrix of the LDPC code has excellent performance, implementation and representation thereof is very complicated. Thus, a structured LDPC code as described above is widely used. As a structured LDPC code, a quasi-cyclic LDPC (QC LDPC) code is widely used.

The QC-LDPC code is composed of a zero matrix, which is a Q×Q matrix, and a circulant permutation matrix (CPM), which is a Q×Q matrix. The circulant permutation matrix Pa takes a form obtained by circularly shifting a Q×Q identity matrix by a circular shift value of a (see FIG. 9). For example, as shown in FIG. 7, the parity check matrix H may consist of (mb+1)×(nb+1) circulant permutation matrices. As described above, the circular shift value 0 represents the identity matrix and −1 represents the zero matrix. In addition, the parity check matrix may be represented by a matrix of circular shift values, as shown in FIG. 8. Here, each of the circular shift values may be set to have a value greater than or equal to −1 and less than or equal to Q−1. The matrix composed of the circular shift values as shown in FIG. 8 may be referred to as a circular shift matrix or a characteristic matrix.

To construct a QC LDPC code of a desired size, a lifting operation may be performed. The lifting is used to obtain a parity check matrix of a desired size from a preset parity check matrix. Various code lengths may be supported by changing the lifting size. For example, floor lifting or modulo lifting may be used. For example, when Q is 20 and the lifting value Z is 5, the size of information that the generated QC LDPC may handle is 100.

Various types of shifting networks may be used to process the lifting operation. For example, for the QC-LDPC code, an interconnection routing network may be defined by the size of a submatrix and the circular-shift values of the respective circulant permutation matrices. For the lifting of the QC-LDPC, shifting network techniques, which are described below, may be used.

For example, a single-size circular shifting network (SS-CS network) uses a barrel shifter having a data array configured with single-size Z alone. The SS-CS network has random rotation of 0, 1, . . . , and Z−1. The random rotation of the SS-CS network is decomposed into consecutive rotations of ceil($\log_2 Z$) by an exponent of 2. Here, ceil(X) represents the maximum integer less than or equal to X. The SS-CS network requires $Z*\text{ceil}(\log_2 Z)$ multiplexers and ceil($\log_2 Z$) steps.

In addition, for example, a multi-size circular shifting (MS-CS) network may be composed of SS-CS network arrays of any size merged into an adaptation network. The MS-CS network may include ceil($\log_2 A$)+ceil($\log_2 Z$) steps of $Z*(\text{ceil}(Z/A)-1+\text{ceil}(\log_2 A))$ multiplexers. Here, A is the largest common divisor for all block sizes.

In addition, for example, a QC-LDPC shifting network (QSN) uses a conventional logarithmic barrel shifter. The QSN may utilize two barrel shifters and a merging network to provide circular shifting for inputs of any size less than or equal to the size of the network. The QSN requires $Z*(2*\text{ceil}(\log_2 Z)-1)+1$ multiplexers and ceil($\log_2 Z$)+1 steps.

The shifting network may be limited to achieve high throughput. In addition, a code block segmentation technique for a transport block employed when the LDPC code is used or the LDPC code and the turbo code are used is described below. In this case, in order to achieve high throughput of the LDPC code, the lifting size Z may be configured as $m*2^n$ (where m is an integer greater than or equal to 1, and n is an integer greater than or equal to 1). When the lifting size Z is limited as described above, a lifting operation corresponding to the value of n that is greater than or equal to 1 and less than or equal to the maximum value may be readily supported using the characteristics of the SS-CS network. Here, m has a value that may be changed according to the configuration of the shifting network. In the following embodiments, m is assumed to be 1 for simplicity. For simplicity, in the following embodiments, one parity check matrix may be used. Information sequences of various lengths may be supported through the lifting operation for one parity check matrix. When one parity check matrix is used, connection of variable nodes and check nodes to the shifting network may be simplified. In addition, because dedicated routing is allowed, high throughput may be achieved.

The LDPC code is less flexible than the turbo code in terms of supportable information sizes. In particular, flexibility may vary depending on the configuration of the shifting network. Flexibility may be further reduced when a $2^n$ shifting network is used to achieve high throughput.

The embodiments described below may be applied for the LDPC code. For example, an N×M parity check matrix may be used. The difference between M and N may be 16. In addition, the maximum lifting value Zmax may be set to 512. That is, for example, m may be set to 1, and n may be set to 9 as the maximum value. In this case, the maximum length of information bits supportable by the LDPC code may be defined as (N−M)*Z. Thus, in this example, the maximum size of supportable information bits is 8192 bits.

As described above, when the transport block is larger than a code block, the transport block is segmented into a plurality of code blocks. For example, the length of information bits that the LDPC code may support according to the lifting value $Z_i$ may be referred to as $K_i$. Here, i is an integer greater than or equal to $\log_2 Z\text{min}$ and less than or equal to $\log_2 Z\text{max}$, where Zmin denotes the minimum value of $Z_i$, and Zmax denotes the maximum value of $Z_i$. In the following embodiments, the index i of the lifting value $Z_i$ is $\log_2 Z_i$.

Information bits having a length less than or equal to $K_i$ may be supported through the shortening technique. In the shortening technique, a preconfigured bit sequence may be added to the information bits such that the length of the information bits becomes $K_i$. The added preconfigured bit sequence may be removed after encoding. However, in the shortening technique, as the length of bits removed after encoding (i.e., the length of the preconfigured bit sequence added to the information bits) increases, performance may deteriorate. Thus, in order to prevent deterioration of performance, information bits having a length greater than or equal to a preset length may be defined to be used. For example, for the lifting size $Z_i$, the minimum allowable length of information bits may be referred to as $K_{imin}$. Thus, $K_{imin}$ always has a value less than $K_i$. For example, when the size of the transport block is $K_{TB}$, the following equation may be satisfied.

$$(n_{CB}-1)*K_{zmax} < K_{TB} < (n_{CB}-1)*K_{zmax}+K_i \quad \text{[Equation 3]}$$

In the equation above, $n_{CB}$ denotes the number of code blocks segmented to construct a transport block. In the equation above, $K_{zmax}$ denotes the length of information bits that is supportable by the maximum lifting value Zmax.

First, when Km is $2*K_{zmax}$, the $2^n$ shifting network has a lifting value in the form of a geometric series having a common ratio r set to 2. Thus, the following equation may be established.

$$\frac{A(1-r^{n-1})}{1-r} = Ar^{n-1} - 1 \quad \text{[Equation 4]}$$

In the equation above, $Ar^{n-1}$ represents the length of information bits corresponding to the lifting value $Z_n$. The equation above represents the sum of the lengths of information bits corresponding to the lifting values $Z_0$ to $Z_{n-1}$. Therefore, the equation above suggests that the size $K_{zmax}$ of information bits supported by Zmax is greater than the sum of the information bits supported by all lifting values except Zmax. Therefore, this feature may be used in code block segmentation.

For example, a transport block having a length less than 16,384 bits may be used. For example, the size Km of the transport block may be 1024 bits. In this case, the transport block may be segmented into an 8192-bit code block and a 2048-bit code block. Alternatively, the transport block may be segmented into five 2048-bit code blocks. In the case of the $2^n$ shifting network, each shifting value may be defined as a geometric series having 1/2 as the common ratio based on the maximum value Zmax. Accordingly, the following equation may be used to determine the number n of code blocks.

$$\frac{K_{zmax}(1-r^{n-1})}{1-r} < K_{TB} < \frac{K_{zmax}(1-r^n)}{1-r} \quad \text{[Equation 5]}$$

When 1/2 is used as the common ratio, the above equation may be summarized as follows.

$$0 < \frac{1}{2}K_{TB} - K_{zmax}\left(1 - \left(\frac{1}{2}\right)^n\right) + K_{zmax}\left(\frac{1}{2}\right)^n < K_{zmax}\left(\frac{1}{2}\right)^n \quad \text{[Equation 6]}$$

For example, the value of n may be determined as a minimum value satisfying the above equation (where n is an integer greater than or equal to 1). For example, when $K_{TB}$ is 10000 and $K_{zmax}$ is 8192, the above equation is not satisfied if n is 1. However, if n is 2, the above equation may be satisfied. Therefore, under the above condition, the transport block may be determined to be composed of two code blocks.

In addition, as described above, flexibility in terms of the size of a code block may be increased by using the shortening technique. In this case, code blocks may be segmented as follows. As the number of code blocks generated by the segmentation increases, the block error rate (BLER) may increase. Accordingly, code block segmentation needs to be performed such that the number of code blocks is small. However, if code block segmentation is performed into only large code blocks, shortening bits may be increased and code performance may deteriorate. In this regard, a code block segmentation method for minimizing the number of code blocks and the length of shortening bits will be described below. More specifically, the number of code blocks may be determined by Equation 6 above. Hereinafter, a specific method for determining the size of code blocks according to the determined number of code blocks will be described.

In the following description, it is assumed that the length $K_{TB}$ of the transport block is greater than the length $K_{zmax}$ of the information bits according to the maximum lifting value. If $K_{TB}$ is less than or equal to $K_{zmax}$, rate matching may be performed through shortening alone without code block segmentation.

First, an integer x is determined so as to satisfy the following equation.

$$K_{zmax} < K_{TB} - xK_{zmax} < 2*K_{zmax} \quad \text{[Equation 7]}$$

In the equation above, x denotes the number of code blocks corresponding to Kzmax determined for the transport block. That is, in this embodiment, the value of x is selected as a value that maximizes $xK_{zmax}$ within the length of the transport block.

When the length of the transport block is less than $2K_{zmax}$, the process associated with Equation 7 described above may be omitted. In the following description, it is assumed that the transport block has a length less than $2K_{zmax}$ or a length of $K_{TB-x}*K_{zmax}$, which satisfies Equation 7 described above.

The code block segmentation may be performed on the transport block in the following manner. The maximum lifting value is selected from among the lifting values having the minimum information bit length less than the length of the transport block. Due to the limitation of the transport block length in this embodiment, the maximum lifting value is always selected first.

Thereafter, the maximum lifting value is selected from among the lifting values having the minimum information bit length less than a value obtained by subtracting the sum of the minimum information bit lengths corresponding to all the previously selected lifting values from the transport block.

Then, when the sum of the code block lengths according to all the previously selected lifting values is greater than or equal to the length of the transport block, selection of a lifting value may be terminated. In this case, the transport block may be composed of a code block having a length obtained by subtracting the sum of the lengths of code blocks according to the other lifting values excluding the selected maximum lifting value, and code blocks according to the other lifting values. That is, shortening is performed on the code block having the greatest length rather than on a code block having a short length.

In addition, for example, if the value obtained by subtracting, from the length of the transport block, the sum of the lengths of the code blocks according to the other lifting values excluding the maximum lifting value among all the selected lifting values is less than the length of minimum information bits for a code block according to the selected maximum lifting value, an additional lifting value less than or equal to the previously selected lifting value may be further selected. Herein, the minimum information bits for one lifting value may refer to a shortened information bit length after the maximum shortening that may be allowed for the information bit length corresponding to the lifting value is performed.

For example, it may be assumed that the length of the transport block is 9000. The length of information bits according to the maximum lifting value may be 8192. When shortening is not considered, the transport block may be segmented into code blocks according to the maximum lifting value and the minimum lifting value corresponding to the remaining length or more. For example, the transport block may be segmented into a code block having a length of 8192 and a code block having a length of 1024. However, in this case, performance of the entire code may be determined by the code block whose length is 1024, which is relatively short. In general, as the length of the code block decreases, performance is degraded, and accordingly overall performance of the code may be reduced.

Therefore, code block segmentation may be performed according to the above-described embodiment. For example, the length of the minimum information block for the code block having a length of 8192 may be 6000, and the length of the minimum information block for the code block having a length of 2048 may be 1800. When the code blocks are segmented according to the above-described method, the maximum lifting value may be selected. Then, 2048, which is a value obtained by subtracting 6000, which is the minimum information bit length according to the previously selected lifting value, from the length of the transport block, may be selected as the maximum lifting value less than 3000. In this case, no more lifting value is selected because the sum of the code block lengths according to all the selected lifting values exceeds the length of the transport block. For example, the transport block may be segmented into a code block having a length of 2048 and a code block having a length of 6952. The code block having a length of 6952 may be generated by shortening of a code block having a length of 8192.

The above-described segmentation of code blocks may be applied even when the length of the transport block is within the length of information bits according to the maximum lifting value and a preset range. For example, when the length of the transport block is 8200, the transport block may be composed of a code block having a length of 2048 and a code block having a length of 6152.

For example, the length of the transport block may be 16540. In addition, the length of information bits according to the maximum lifting value is assumed to be 8192. In this case, the length of the transport block exceeds twice the length of the information bits according to the maximum lifting value. Accordingly, x is determined to be 1 by the above-described equation. The code block segmentation is performed on 8348, which is a value obtained by subtracting one information bit length according to the maximum lifting value from the length of the transport block. First, 8192 is selected as the maximum lifting value. In this case, the minimum information bit length for the maximum lifting value is assumed to be 6000. For example, the length of minimum information bits allowable for a code block having a length of 4096 may be greater than or equal to 3348. Thus, as a subsequent lifting value, a lifting value corresponding to a code block having a minimum information bit length less than 3348 is selected. For example, a lifting value corresponding to a length of 2048 may be selected. In this case, the number of code blocks may be determined according to the number x of the determined maximum lifting values and the number of the selected lifting values. In the above example, the transport block may be composed of code blocks corresponding to two maximum lifting values and a code block having a length of 2048. In addition, the shortening may be performed only on a code block corresponding to one maximum lifting value. In this case, the transport block may be composed of a code block having a length of 8192, a code block having a length of 6300, and a code block having a length of 2048. Alternatively, the shortening may be performed equally on the entire code blocks corresponding to all the maximum lifting values. In this case, the transport block may be composed of 2 code blocks having a length of 7246 and a code block having a length of 2048.

As described above, performance of the transport block of the LDPC code depends on the smallest code block. Accordingly, in order to increase the size of the code block having the shortest length, the following shortening technique may be performed.

Once lifting values are selected according to the above-described operations, the length of shortening bits may be determined. For example, a value obtained by subtracting the length of the transport block from the sum of the code block lengths according to the selected lifting values may be determined as the length of the shortening bits.

In addition, the maximum shortening bit lengths for the respective code blocks are summed until the sum of the lengths of the maximum shortening bits for the respective code blocks is greater than or equal to the length of determined shortening bits. In addition, for example, the selected least lifting value may be a first lifting value. If a value obtained by adding the length of a code block according to the first lifting value to the sum of the maximum shortening bit lengths exceeds the length of a code block according to a second lifting value greater than the first lifting value, the second lifting value may be selected in place of the first lifting value. If the second lifting value is greater than or equal to the maximum lifting value, the second lifting value is set as the maximum lifting value. Shortening may then be performed on the code blocks according to re-selected lifting values. Shortening may be equally performed on the largest code block.

For example, as in the above example, a transport block whose length is 16540 may be composed of 2 code blocks having a length of 7246 and a code block having a length of 2048. In this case, the length of shortening bits for the previously selected lifting value is 1892 bits. In case of maximum shortening for maximum lifting values, the length of the maximum shortening bits for the code block corresponding to the maximum lifting value may be set to 2192. Since the maximum shortening for a code block of one maximum length is greater than the determined shortening bit length 1892, the length of the maximum shortening bits is added to the code block whose length is 2048. The result exceeds length 4096 of the information bits according to a lifting value that is greater than the lifting value corresponding to length 2048. Thus, a lifting value corresponding to length 4096 is selected instead of the lifting value corresponding to length 2192. Then, the shortening may be performed equally on the largest code block. In this case, the transport block whose length is 16540 may be composed of two code blocks having a length of 6222 and one code block having a length of 4096.

In the LDPC code, the minimum information bit length for each lifting value may be determined according to performance of the parity check matrix. For example, the minimum information bit length $K_{imin}$ for the information bit length $K_i$ according to the lifting value $Z_i$ may be set to $K_i/2+1$. For example, the minimum information bit length $K_{imin}$ for the information bit length $K_i$ according to the lifting value $Z_i$ may be set to $K_i*x$. Here, the value of x may be dependent on the value of i or be set independently from the value of i.

Further, in the LDPC code, an employed lifting value may be shared between the transmitting end and the receiving end. For example, in order to transmit information about code block segmentation, the following methods may be used.

For example, information about the entire transportation block may be transmitted to the receiving end. For example, the receiving end may derive lifting values from the information about the entire transport block based on the method described above.

In addition, for example, the transmitting end may transmit information about the number of segmented code blocks and the size of the code blocks. For example, serial number information about each of the segmented code blocks may be transmitted as the information about the number of segmented code blocks. In addition, the information about the size of the code blocks may include information about the employed lifting value.

Particularly, in the LDPC code, the shortening on a code block of a small size may degrade the performance of the entire code as described above. Therefore, the size of the code block may be limited to be greater than or equal to a preset size. Thus, in the above-described embodiment, for example, the lifting value may be limited to be at least greater than or equal to a certain value.

The above-described examples are mainly based on the LDPC code. However, the LDPC code has a lower flexibility than the turbo code in terms of the information size and code rate. Thus, in order to overcome this disadvantage, the LDPC code may be used together with the turbo code. In this case, the lifting value may be limited as described above. In this case, information about the limitation may be transmitted to the receiving end. For example, information about a limited lifting value (e.g., index number) may be transmitted to the receiving end. Alternatively, the difference between the index of the maximum lifting value and the index of the minimum lifting value may be transmitted to the receiving end.

Figure 13:
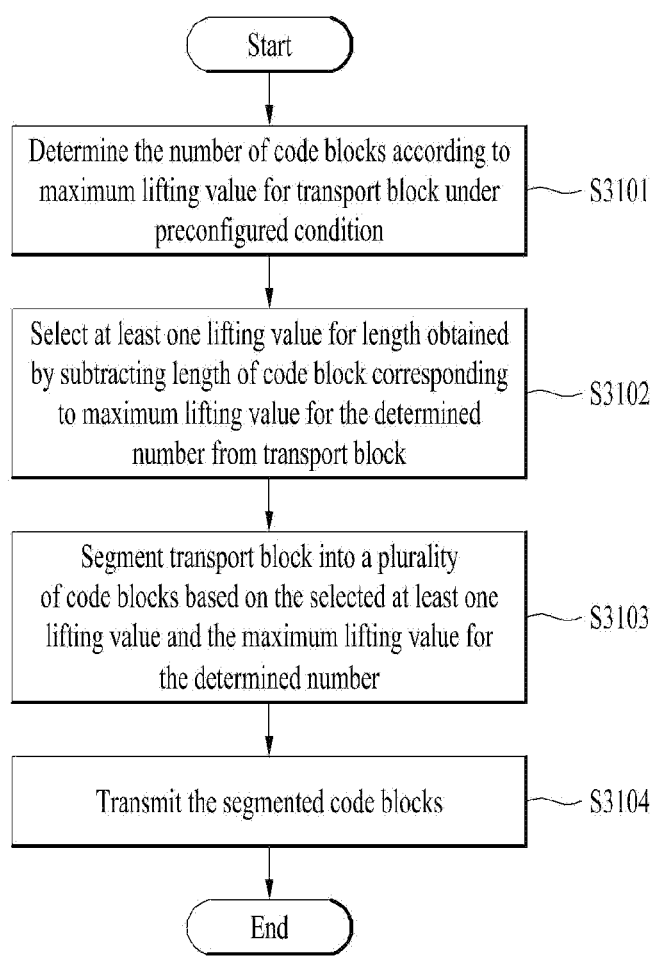
FIG. 13 is a flowchart illustrating an example of a transport block segmentation method.

FIG. 13 is a flowchart illustrating an example of a transport block segmentation method.

In the embodiment of FIG. 13, the transport block segmentation method may be carried out by a transmitting end. For example, the transmitting end may be a UE or a base station. For example, the transmitting end may have a shifting network having lifting values in the form of $2^n$ (where n is an integer greater than or equal to 0). For example, the transmitting end may lift the LDPC code using a single-size circular shifting network.

First, the transmitting end may determine the number of code blocks according to the maximum lifting value for the transport block under a preconfigured condition (S1301). Here, the preconfigured condition may refer to Equation 7.

In addition, the transmitting end may select at least one lifting value for the length obtained by subtracting the length of the code block corresponding to the maximum lifting value for the determined number from the transport block (S1302). Here, the length obtained by subtracting the length of the code block corresponding to the maximum lifting value for the determined number from the transport block may be referred to as a first length. The transmitting end may select the greatest lifting value among the lifting values having the minimum information bit length less than the first length. The transmitting end may then update the first length by subtracting the minimum information bit length corresponding to the selected lifting value from the first length. Further, the transmitting end may repeat the selection of a lifting value and the update of the first length until the sum of the lengths of the code blocks corresponding to the selected lifting values and the determined maximum lifting value exceeds the length of the transport block.

Further, the transmitting end may segment the transport block into a plurality of code blocks based on the selected at least one lifting value and the maximum lifting value for the determined number (S1303). The segmentation of the code blocks may include shortening on at least one code block corresponding to the greatest lifting value. In addition, the transmitting end may transmit the segmented code blocks to the receiving end (S1304). The transmitting end may also transmit information about the segmented code blocks to the receiving end. The information about the code blocks may include at least one of the number of segmented code blocks, the size of the code blocks, and information about the selected lifting value.

Figure 14:
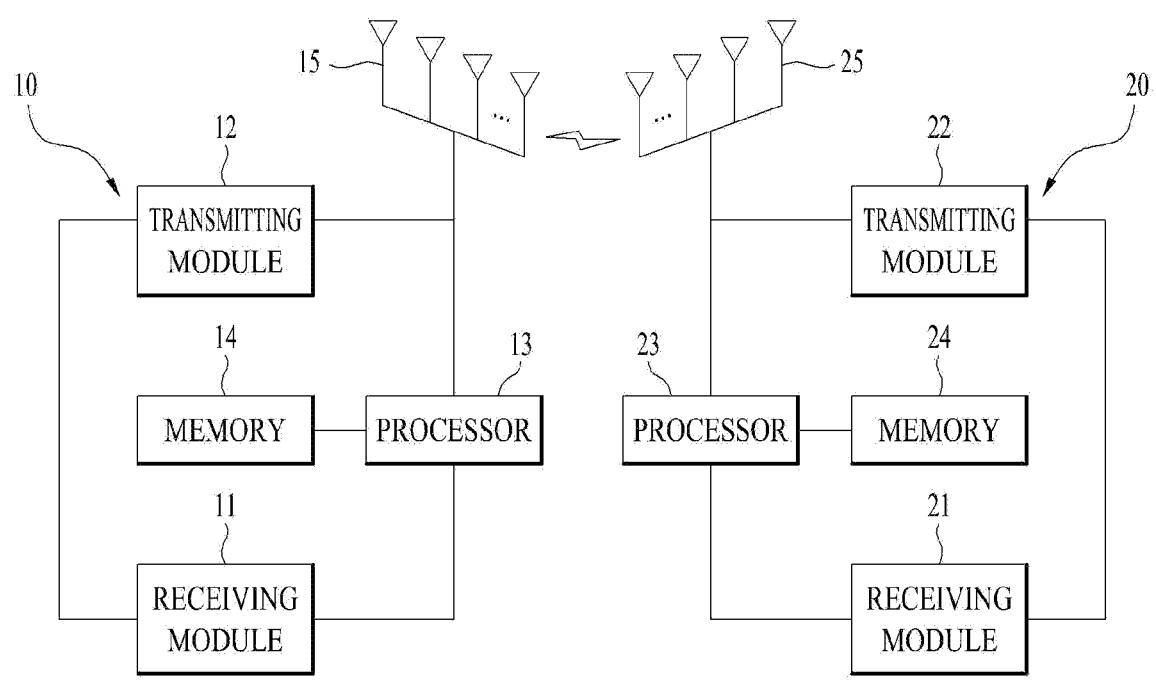
FIG. 14 is a block diagram illustrating configurations of a base station (BS) and a user equipment (UE) according to an embodiment of the present disclosure.

FIG. 14 is a schematic diagram for explanation of components of apparatuses to which the embodiments of the present invention of FIGS. 1 to 13 are applicable, according to an embodiment of the present invention.

Referring to FIG. 14, a BS apparatus 10 according to the present invention may include a receiving module 11, a transmitting module 12, a processor 13, a memory 14, and a plurality of antennas 15. The transmitting module 12 may transmit various signals, data, and information to an external apparatus (e.g., a UE). The receiving module 11 may receive various signals, data, and information from an external apparatus (e.g., a UE). The receiving module 11 and the transmitting module 12 may each be referred to as a transceiver. The processor 13 may control an overall operation of the BS apparatus 10. The antennas 15 may be configured according to, for example, 2-dimensional (2D) antenna arrangement.

The processor 13 of the BS apparatus 10 according to an embodiment of the present invention may be configured to receive channel state information according to proposed embodiments of the present invention. In addition, the processor 13 of the BS apparatus 10 may perform a function for calculating and processing information received by the BS apparatus 10 and information to be externally transmitted, and the memory 14 may store the calculated and processed information for a predetermined time period and may be replaced with a component such as a buffer (not shown) or the like.

Referring to FIG. 14, a UE apparatus 20 according to the present invention may include a receiving module 21, a transmitting module 22, a processor 23, a memory 24, and a plurality of antennas 25. The antennas 25 refer to a terminal apparatus for supporting MIMO transmission and reception. The transmitting module 22 may transmit various signals, data, and information to an external apparatus (e.g., an eNB). The receiving module 21 may receive various signals, data, and information from an external apparatus (e.g., an eNB). The receiving module 21 and the transmitting module 22 may each be referred to as a transceiver. The processor 23 may control an overall operation of the UE apparatus 20.

The processor 23 of the UE apparatus 20 according to an embodiment of the present invention may be configured to transmit channel state information according to proposed embodiments of the present invention. In addition, the processor 23 of the UE apparatus 20 may perform a function for calculating and processing information received by the UE apparatus 20 and information to be externally transmitted, and the memory 24 may store the calculated and processed information for a predetermined time period and may be replaced with a component such as a buffer (not shown) or the like.

The aforementioned components of the BS apparatus 10 and the UE apparatus 20 may be embodied by independently applying the above description of the present invention or simultaneously applying two or more embodiments of the present invention, and a repeated description is not given for clarity.

In addition, with regard to the various embodiments of the present invention, although an example in which a downlink transmission entity or an uplink reception entity is an eNB and a downlink reception entity or an uplink transmission entity is a UE has been described, the scope of the present invention is not limited thereto. For example, the above description of the eNB may be applied in the same way to the case in which a cell, an antenna port, an antenna port group, an RRH, a transmission point, a reception point, an access point, a relay, etc. are a downlink transmission entity to a UE or an uplink reception entity from the UE. In addition, the principle of the present invention that has been described with regard to the various embodiments of the present invention may also be applied in the same way to the case in which a relay is a downlink transmission entity to a UE or an uplink reception entity to a UE or the case in which a relay is an uplink transmission entity to an eNB or a downlink reception entity from an eNB.

The embodiments of the present disclosure may be achieved by various means, for example, hardware, firmware, software, or a combination thereof.

In a hardware configuration, an embodiment of the present disclosure may be achieved by one or more application specific integrated circuits (ASICs), digital signal processors (DSPs), digital signal processing devices (DSDPs), programmable logic devices (PLDs), field programmable gate arrays (FPGAs), processors, controllers, microcontrollers, microprocessors, etc.

In a firmware or software configuration, an embodiment of the present disclosure may be implemented in the form of a module, a procedure, a function, etc. Software code may be stored in a memory unit and executed by a processor. The memory unit is located at the interior or exterior of the processor and may transmit and receive data to and from the processor via various known means.

The embodiments of the present disclosure described above are combinations of elements and features of the present disclosure. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present disclosure may be rearranged. Some constructions of any one embodiment may be included in another embodiment and may be replaced with corresponding constructions of another embodiment. It is obvious to those skilled in the art that claims that are not explicitly cited in each other in the appended claims may be presented in combination as an embodiment of the present disclosure or included as a new claim by a subsequent amendment after the application is filed.

It will be apparent to those skilled in the art that various modifications and variations may be made in the present disclosure without departing from the spirit or scope of the disclosures. Thus, it is intended that the present disclosure covers the modifications and variations of this disclosure provided they come within the scope of the appended claims and their equivalents.

INDUSTRIAL APPLICABILITY

The embodiments of the present disclosure are applicable to various wireless access systems and broadcasting communication systems. Examples of the various wireless access systems include a 3rd generation partnership project (3GPP) system, a 3GPP2 system, and/or an institute of electrical and electronics engineers (IEEE) 802.xx system. The embodiments of the present disclosure may be applied to all technical fields in which the various wireless access systems find their applications, as well as the various wireless access systems.

The invention claimed is:

1. A method for segmenting a transport block of a Low Density Parity Check (LDPC) code by a terminal having a $2^n$ shifting network, the method comprising:
    determining a number of code blocks, based on a maximum lifting value for the transport block among a plurality of predetermined lifting values under a preconfigured condition,
    wherein the plurality of predetermined lifting values take a form of $A \times 2^n$, where A is an integer greater than or equal to 1 and n is an integer greater than or equal to 0, and
    selecting at least one lifting value among the plurality of predetermined lifting values, for a first length obtained by subtracting a length based on the determined number of code blocks from the transport block;
    segmenting the transport block into a plurality of code blocks based on the selected at least one lifting value and the determined number of code blocks; and
    transmitting the segmented code blocks,
    wherein the preconfigured condition comprises determining the number of code blocks based on the maximum lifting value such that the first length is greater than a length of the code blocks based on the maximum lifting value and smaller than twice the length of the code blocks based on the maximum lifting value,
    wherein selecting at least one lifting value comprises:
    selecting a greatest lifting value, among lifting values having a minimum information bit length smaller than the first length in the plurality of predetermined lifting values, until a sum of a length of a code block related to the at least one lifting value and a length related to the determined number of code blocks based on the maximum lifting value exceeds a length of the transport block; and
    repeating update of the first length by subtracting a minimum information bit length related to the selected lifting value from the first length.

2. The method of claim 1, wherein the minimum information bit length is a length obtained by applying maximum shortening to an information bit length based on a related lifting value.

3. The method of claim 1, the method further comprising:
    performing shortening on at least one code block having a maximum length among the plurality of code blocks.

4. The method of claim 3, wherein the plurality of code blocks include a plurality of maximum length code blocks, wherein shortening of same scale is performed on the plurality of maximum length code blocks.

5. The method according to claim 1, the method further comprising:
    transmitting information related to the number of the code blocks.

6. The method according to claim 1, the method further comprising:
    transmitting information related to the selected at least one lifting value.

7. A terminal of a wireless communication system, the terminal comprising:
    a transceiver configured to transmit and receive signals;
    a memory; and
    at least one processor configured to control the transceiver and the memory,
    wherein the at least one processor is configured to segment a transport block of a Low Density Parity Check (LDPC) code based on a $2^n$ shifting network,
    wherein the at least one processor is further configured to:
    determine a number of code blocks, based on a maximum lifting value for the transport block among a plurality of predetermined lifting values under a preconfigured condition;
    select at least one lifting value among the plurality of predetermined lifting values, for a first length obtained by subtracting a length based on the determined number of code blocks from the transport block;
    segment the transport block into a plurality of code blocks based on the selected at least one lifting value and the determined number of code blocks; and
    transmit the segmented code blocks,
    wherein the preconfigured condition comprises determining the number of code blocks based on the maximum lifting value such that the first length is greater than a length of the code blocks based on the maximum lifting value and smaller than twice the length of the code blocks based on the maximum lifting value,
    wherein the at least one lifting value is selected by selecting a greatest lifting value, among lifting values having a minimum information bit length smaller than the first length in the plurality of predetermined lifting values, until a sum of a length of a code block related to the at least one lifting value and a length related to the determined number of code blocks based on the maximum lifting value exceeds a length of the transport block, and repeating update of the first length by subtracting a minimum information bit length related to the selected lifting value from the first length, and wherein the plurality of predetermined lifting values take a form of $A \times 2^n$, where A is an integer greater than or equal to 1 and n is an integer greater than or equal to 0.

8. The terminal of claim 7, wherein the minimum information bit length is a length obtained by applying maximum shortening to an information bit length based on a related lifting value.

9. The terminal of claim 7, wherein the processor is further configured to perform shortening on at least one code block having a maximum length among the plurality of code blocks.

10. The terminal of claim 9, wherein the plurality of code blocks include a plurality of maximum length code blocks,
wherein shortening of same scale is performed on the plurality of maximum length code blocks.

* * * * *